United States Patent
Handford

(10) Patent No.: US 11,955,994 B2
(45) Date of Patent: *Apr. 9, 2024

(54) DATA PROCESSING APPARATUSES, METHODS, COMPUTER PROGRAMS AND COMPUTER-READABLE MEDIA

(71) Applicant: V-NOVA INTERNATIONAL LIMITED, London (GB)

(72) Inventor: David Handford, London (GB)

(73) Assignee: V-NOVA INTERNATIONAL LIMITED (GB)

(*) Notice: Subject to any disclaimer, the term of this patent is extended or adjusted under 35 U.S.C. 154(b) by 385 days.

This patent is subject to a terminal disclaimer.

(21) Appl. No.: 17/319,220

(22) Filed: May 13, 2021

(65) Prior Publication Data

US 2021/0336634 A1    Oct. 28, 2021

Related U.S. Application Data

(63) Continuation of application No. 16/817,164, filed on Mar. 12, 2020, now Pat. No. 11,012,088, which is a
(Continued)

(30) Foreign Application Priority Data

Sep. 8, 2016  (GB) .................................. 1615267

(51) Int. Cl.
  *H03M 7/38*  (2006.01)
  *H03M 7/18*  (2006.01)
  (Continued)

(52) U.S. Cl.
  CPC ........... *H03M 7/3062* (2013.01); *H03M 7/18* (2013.01); *H03M 7/3002* (2013.01);
  (Continued)

(58) Field of Classification Search
  CPC ........... H03M 13/2906; H03M 13/611; H03M 13/05; H03M 13/2957; H03M 13/6331;
  (Continued)

(56) References Cited

U.S. PATENT DOCUMENTS 6,323,914 B1 * 11/2001 Linzer ................. H04N 19/105
  375/E7.218
6,771,830 B2   8/2004 Goldstein et al.
  (Continued)

FOREIGN PATENT DOCUMENTS

CN           105432083        3/2016
EP             2200322        6/2010
  (Continued)

OTHER PUBLICATIONS

Corrado, S. et al., "Improving H.264 performances by quantization of motion vectors", 2009 Picture Coding Symposium, Chicago, 2009, pp. 1-4. doi:10.1109/PCS.2009.5167401.
(Continued)

*Primary Examiner* — Linh V Nguyen
(74) *Attorney, Agent, or Firm* — WORKMAN NYDEGGER

(57) ABSTRACT

A first value of a first data element in a first set of data elements is obtained, the first set of data elements being based on a first time sample of a signal. A second value of a second data element in a second set of data elements is obtained, the second set of data elements being based on a second, later time sample of the signal. A measure of similarity is derived between the first value and the second value. Based on the derived measure, a quantisation parameter useable in performing quantisation on data based on the first time sample of the signal is determined. Output data is generated using the quantisation parameter.

20 Claims, 7 Drawing Sheets

Related U.S. Application Data continuation of application No. 16/295,854, filed on Mar. 7, 2019, now Pat. No. 10,735,024, which is a continuation of application No. PCT/GB2017/052633, filed on Sep. 8, 2017.

(51) Int. Cl.

| | | |
|---|---|---|
| *H03M 7/30* | (2006.01) | |
| *H03M 7/32* | (2006.01) | |
| *H04N 19/124* | (2014.01) | |
| *H04N 19/137* | (2014.01) | |
| *H04N 19/176* | (2014.01) | |
| *H04N 19/30* | (2014.01) | |
| *H04N 19/172* | (2014.01) | |
| *H04N 19/182* | (2014.01) | |

(52) U.S. Cl.
CPC ......... *H04N 19/124* (2014.11); *H04N 19/137* (2014.11); *H04N 19/176* (2014.11); *H04N 19/30* (2014.11); *H04N 19/172* (2014.11); *H04N 19/182* (2014.11)

(58) Field of Classification Search
CPC .. H03M 5/145; H03M 13/11; H03M 13/2909; H03M 13/31; H03M 7/6011; H03M 13/27; H03M 13/00; H03M 13/096; H03M 13/2792; H03M 13/2948; H03M 13/23; H03M 13/2927; H03M 13/2975; H03M 13/39; H04N 19/176; H04N 19/124; H04N 19/61; H04N 19/105; H04N 19/136; H04N 19/126; H04N 19/172; H04N 19/523; H04N 19/109; H04N 19/134; H04N 19/139; H04N 19/146; H04N 19/149; H04N 19/20; H04N 19/40; H04N 19/436; H04N 19/513; H04N 19/587; H04N 19/60
USPC .................................. 341/50, 51, 67, 76, 107
See application file for complete search history.

(56) References Cited

U.S. PATENT DOCUMENTS

| | | | | |
|---|---|---|---|---|
| 8,081,682 | B1* | 12/2011 | Carbacea | H04N 19/176 |
| | | | | 375/240.24 |
| 8,223,057 | B2 | 7/2012 | Carter et al. | |
| 8,345,996 | B2* | 1/2013 | Kudana | H04N 19/105 |
| | | | | 375/240.16 |
| 8,804,824 | B1 | 8/2014 | Linzer | |
| 8,976,856 | B2* | 3/2015 | Haskell | H04N 19/86 |
| | | | | 375/240 |
| 9,281,007 | B2 | 3/2016 | Wu et al. | |
| 10,015,495 | B2* | 7/2018 | Tandon | H04N 19/625 |
| 10,733,094 | B2 | 8/2020 | Kwak | |
| 10,776,052 | B2 | 9/2020 | Suzuki et al. | |
| 10,812,630 | B2 | 10/2020 | Beckman et al. | |
| 10,924,746 | B2* | 2/2021 | Chuang | H04N 19/105 |
| 2001/0041016 | A1 | 11/2001 | Goldstein et al. | |
| 2005/0152619 | A1* | 7/2005 | Motomura | G06T 3/40 |
| | | | | 382/299 |
| 2006/0015496 | A1* | 1/2006 | Keating | G06F 16/5838 |
| 2007/0047843 | A1* | 3/2007 | Kazama | G11B 27/034 |
| | | | | 382/305 |
| 2007/0071105 | A1* | 3/2007 | Tian | H04N 19/109 |
| | | | | 375/E7.149 |
| 2012/0007753 | A1* | 1/2012 | Maeda | H03M 7/40 |
| | | | | 341/67 |
| 2013/0136171 | A1* | 5/2013 | Lee | H04N 19/51 |
| | | | | 375/240.03 |
| 2013/0188700 | A1* | 7/2013 | Guo | H04N 19/50 |
| | | | | 375/240.12 |
| 2014/0029664 | A1 | 1/2014 | Au et al. | |
| 2016/0065968 | A1 | 3/2016 | Suvanto | |
| 2018/0184092 | A1* | 6/2018 | Jung | H04N 19/124 |
| 2020/0366899 | A1* | 11/2020 | Fitzgerald | H04N 19/146 |
| 2020/0374555 | A1* | 11/2020 | Gao | H04N 19/124 |

FOREIGN PATENT DOCUMENTS

| | | |
|---|---|---|
| EP | 2249571 | 11/2010 |
| WO | 2013003284 | 1/2013 |

OTHER PUBLICATIONS

Riedl, et al.: Multiscale recurrence analysis of spatio-temporal data, Chaos, Dec. 2015.
International Search Report and Written Opinion dated Feb. 12, 2018 for PCT Application No. PCT/GB2017/052633.
UKIPO Search Report dated Mar. 6, 2017 for Application No. GB1615267.0.
U.S. Appl. No. 16/295,854, filed Dec. 9, 2019, Office Action.
U.S. Appl. No. 16/295,854, filed Mar. 24, 2020, Notice of Allowance.
U.S. Appl. No. 16/817,164, filed Jan. 19, 2021, Notice of Allowance.

\* cited by examiner

DATA PROCESSING APPARATUSES, METHODS, COMPUTER PROGRAMS AND COMPUTER-READABLE MEDIA

CROSS-REFERENCE TO RELATED APPLICATIONS

This application is a continuation of U.S. patent application Ser. No. 16/817,164, filed Mar. 12, 2020, which is a continuation of U.S. patent application Ser. No. 16/295,854, filed Mar. 7, 2019, which is a continuation of International Application No. PCT/GB2017/052633, filed Sep. 8, 2017, which claims priority to UK Application No. 1615267.0, filed Sep. 8, 2016, under 35 U.S.C. 119(a). Each of the above-referenced patent applications is incorporated by reference in its entirety.

BACKGROUND OF THE INVENTION

Field of the Invention

This invention relates to data processing apparatuses, methods, computer programs and computer-readable media.

Description of the Related Technology

Compression and decompression of signals is a consideration in many known systems. Many types of signal, for example video, audio or volumetric signals, may be compressed and encoded for transmission, for example over a data communications network. Signals may also be stored in a compressed form, for example on a storage medium such as a Digital Versatile Disc (DVD). When such a signal is decoded, it may be desired to increase a level of quality of the signal and/or recover as much of the information contained in the original signal as possible.

Quantisation is one technique that may be used in performing signal compression. Quantisation involves approximating a relatively large set of values by a relatively small set of values, for example by rounding, thresholding or truncating the values in the relatively large set. The objective of a quantisation operation is to reduce the amount of data in quantised output data compared to that in the input data to the quantisation operation.

Some known systems exploit scalable encoding techniques. Scalable encoding involves encoding a signal along with information to allow the reconstruction of the signal at one or more different levels of quality, for example depending on the capabilities of the decoder and the available bandwidth. However, relatively large amounts of information may still be stored and/or transmitted, particularly as the usage of higher quality, higher definition video becomes more widespread.

SUMMARY

According to a first aspect of the present invention, there is provided an apparatus configured to: obtain a first value of a first data element in a first set of data elements, the first set of data elements being based on a first time sample of a signal; obtain a second value of a second data element in a second set of data elements, the second set of data elements being based on a second, later time sample of the signal; derive a measure of similarity between the first value and the second value; determine, based on the derived measure of similarity, at least one quantisation parameter useable in performing quantisation on data based on the first time sample of the signal; and generate output data using the at least one quantisation parameter.

According to a second aspect of the present invention, there is provided a method comprising: obtaining a first value of a first data element in a first set of data elements, the first set of data elements being based on a first time sample of a signal; obtaining a second value of a second data element in a second set of data elements, the second set of data elements being based on a second, later time sample of the signal; deriving a measure of similarity between the first value and the second value; determining, based on the derived measure of similarity, at least one quantisation parameter useable in performing quantisation on data based on the first time sample of the signal; and generating output data using the at least one quantisation parameter.

According to a third aspect of the present invention, there is provided a computer program comprising instructions which, when executed, cause an apparatus to perform a method comprising: obtaining a first value of a first data element in a first set of data elements, the first set of data elements being based on a first time sample of a signal; obtaining a second value of a second data element in a second set of data elements, the second set of data elements being based on a second, later time sample of the signal; deriving a measure of similarity between the first value and the second value; determining, based on the derived measure of similarity, at least one quantisation parameter useable in performing quantisation on data based on the first time sample of the signal; and generating output data using the at least one quantisation parameter.

According to a fourth aspect of the present invention, there is provided a computer-readable medium comprising a computer program comprising instructions which, when executed, cause an apparatus to perform a method comprising: obtaining a first value of a first data element in a first set of data elements, the first set of data elements being based on a first time sample of a signal; obtaining a second value of a second data element in a second set of data elements, the second set of data elements being based on a second, later time sample of the signal; deriving a measure of similarity between the first value and the second value; determining, based on the derived measure of similarity, at least one quantisation parameter useable in performing quantisation on data based on the first time sample of the signal; and generating output data using the at least one quantisation parameter.

Further features and advantages will become apparent from the following description, given by way of example only, which is made with reference to the accompanying drawings.

DETAILED DESCRIPTION OF CERTAIN INVENTIVE EMBODIMENTS

Figure 1:
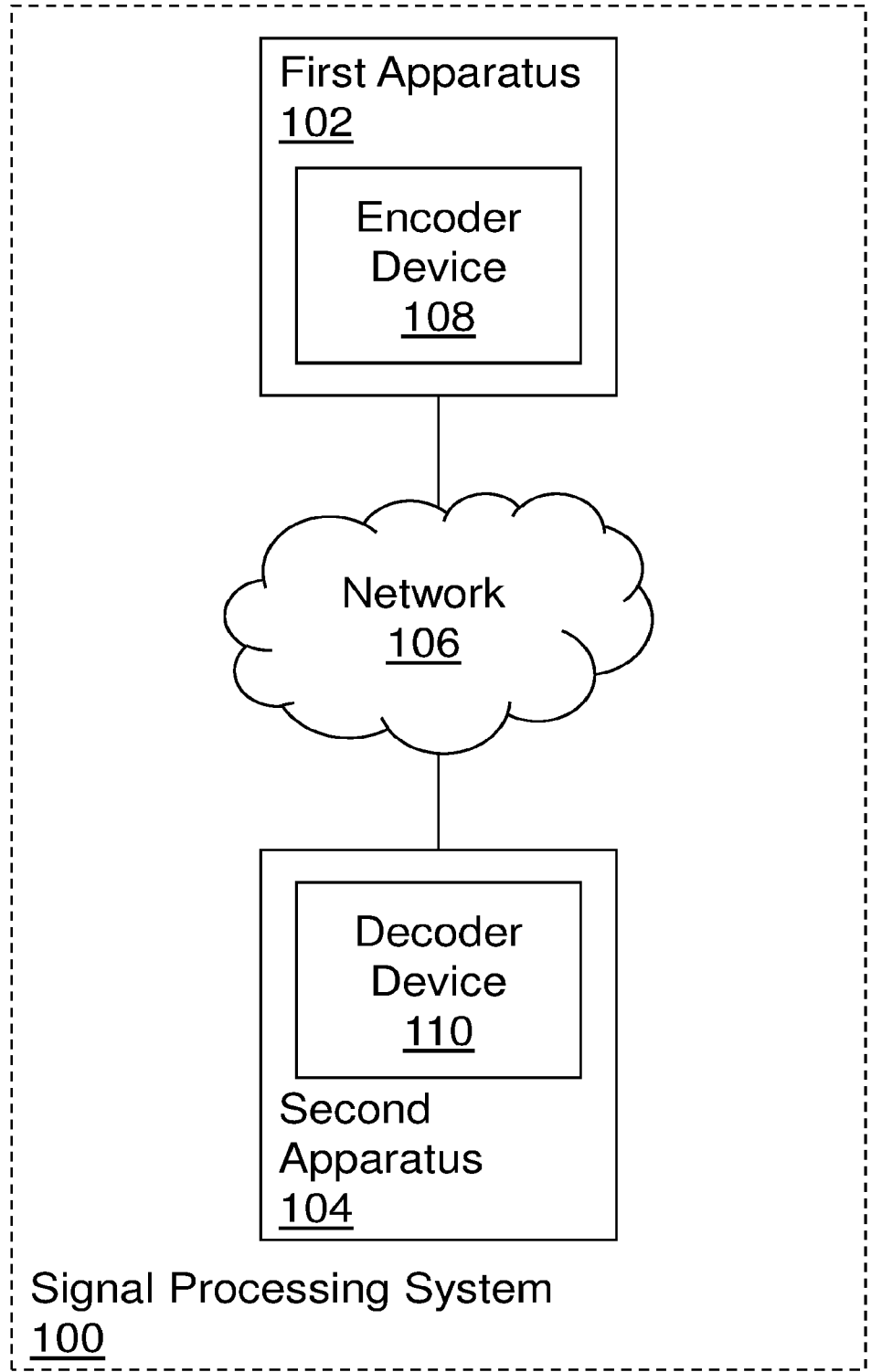
FIG. 1 shows a schematic block diagram of an example of a signal processing system in accordance with an embodiment of the present invention.

Referring to FIG. 1, there is shown an example of a signal processing system 100. The signal processing system 100 is used to process signals. Examples of types of signal include, but are not limited to, video signals, image signals, audio signals, volumetric signals such as those used in medical, scientific or holographic imaging, or other multidimensional signals.

The signal processing system 100 includes a first apparatus 102 and a second apparatus 104. The first apparatus 102 and second apparatus 104 may have a client-server relationship, with the first apparatus 102 performing the functions of a server device and the second apparatus 104 performing the functions of a client device. The signal processing system 100 may include at least one additional apparatus (not shown). The first apparatus 102 and/or second apparatus 104 may comprise one or more components. The components may be implemented in hardware and/or software. The one or more components may be co-located or may be located remotely from each other in the signal processing system 100. Examples of types of apparatus include, but are not limited to, computerised devices, routers, workstations, handheld or laptop computers, tablets, mobile devices, games consoles, smart televisions, set-top boxes, augmented and/or virtual reality headsets etc.

The first apparatus 102 is communicatively coupled to the second apparatus 104 via a data communications network 106. Examples of the data communications network 106 include, but are not limited to, the Internet, a Local Area Network (LAN) and a Wide Area Network (WAN). The first and/or second apparatus 102, 104 may have a wired and/or wireless connection to the data communications network 106.

The first apparatus 102 comprises an encoder device 108. The encoder device 108 is configured to encode data comprised in the signal, which is referred to hereinafter as "signal data". The encoder device 108 may perform one or more further functions in addition to encoding signal data. The encoder device 108 may be embodied in various different ways. For example, the encoder device 108 may be embodied in hardware and/or software.

The second apparatus 104 comprises a decoder device 110. The decoder device is configured to decode signal data. The decoder device 110 may perform one or more further functions in addition to decoding signal data. The decoder device 110 may be embodied in various different ways. For example, the decoder device 110 may be embodied in hardware and/or software.

The encoder device 108 encodes signal data and transmits the encoded signal data to the decoder device 110 via the data communications network 106. The decoder device 110 decodes the received, encoded signal data and generates decoded signal data. The decoder device 110 may output the decoded signal data, or data derived using the decoded signal data. For example, the decoder device 110 may output such data for display on one or more display devices associated with the second apparatus 104.

In some examples described herein, the encoder device 108 transmits to the decoder device 110 a representation of a signal at a given level of quality and information the decoder device 110 can use to reconstruct a representation of the signal at one or more higher levels of quality. A representation of a signal at a given level of quality may be considered to be a rendition, version or depiction of data comprised in the signal at the given level of quality. The information the decoder device 110 can use to reconstruct the representation of the signal at the one or more higher levels of quality may be referred to as "reconstruction data". In some examples, the reconstruction data is included in the signal data that is encoded by the encoder device 108 and transmitted to the decoder device 110. In some examples, the reconstruction data is encoded and transmitted separately from the signal data.

In some examples, the encoder device 108 performs one or more quantisation operations on all or part of the signal data and/or on all or part of the reconstruction data. The one or more quantisation operations may be performed prior to encoding the signal data and/or the reconstruction data. In some examples, the one or more quantisation operations are part of the encoding process.

Figure 2:
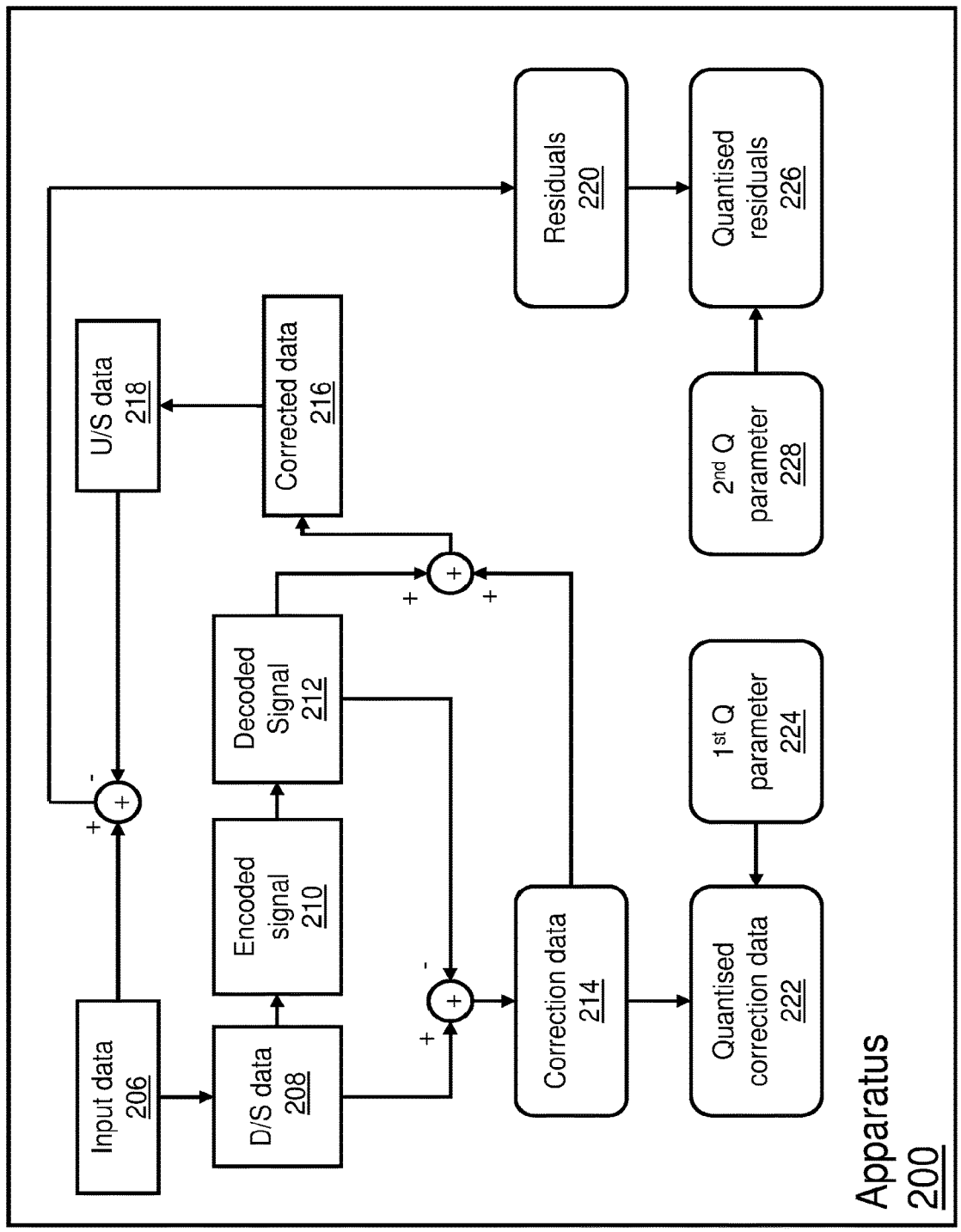
FIG. 2 shows a schematic block diagram of an example of an apparatus in accordance with an embodiment of the present invention.

Referring to FIG. 2, there is shown schematically an example of a data processing apparatus 200. The data processing apparatus 200 may comprise an encoder device.

In the data processing apparatus 200, items are shown on four logical levels. Items on the first, highest logical level relate to data at a relatively high level of quality. The level of quality of the first logical level is high compared to that of at least some other logical levels. Items on the second logical level relate to data at a relatively low level of quality. The level of quality of the second logical level is low compared to that of at least some other logical levels. Items on the third logical level relate to additional data. Items on the fourth, lowest logical level relate to quantisation of data. The relatively high and relatively low levels of quality are part of a tiered hierarchy having multiple levels of quality. In some examples, the tiered hierarchy comprises more than two levels of quality. In such examples, the data processing apparatus 200 may include more than two different levels of quality.

The data processing apparatus 200 obtains a representation (or 'rendition') of a first time sample, $t.sub.1$, of a signal at a relatively high level of quality 206. Obtaining the representation of the first time sample, $t.sub.1$, of the signal at the relatively high level of quality 206 may comprise receiving the representation from one or more other entities. The rendition of the first time sample, $t.sub.1$, of the signal at the relatively high level of quality 206 will be referred to as "input data" hereinafter as, in this example, it is data provided as an input to the data processing apparatus 200.

When the signal is a video signal, the first time sample of the signal may be all or part of an image, frame or field from a sequence of images or frames making up the video signal. The input data 206 may comprise a set of signal elements. A signal element may be considered to be or correspond to a component of the input data 206. For example, where the input data 206 is an image, a signal element may be or may correspond to a pixel in the image. In this example, the input data 206 relates to part of an image. The part of the image may be referred to as a tile. The entire image may comprise many such tiles. The techniques described herein may be repeated in the same or a similar manner for some or all of the other tiles in the image.

The data processing apparatus 200 derives data 208 based on the input data 206. In this example, the data 208 based on the input data 206 is a preliminary representation 208 of the first time sample, $t_1$, of the signal at the relatively low level of quality. The representation 208 is preliminary in the sense that it may be subject to one or more additional processing operations at the relatively low level of quality. In this example, the data 208 is derived by performing a downsampling operation on the input data 206 and will therefore be referred to as "downsampled data" hereinafter. In other examples, the data 208 is derived by performing an operation other than a downsampling operation on the input data 206.

In this example, the downsampled data 208 is encoded to produce an encoded signal 210 at the relatively low level of quality. In some examples, the data processing apparatus 200 encodes the downsampled data 208 to produce the encoded signal 210. The data processing apparatus 200 may output the encoded signal 210, for example for transmission to at least one further apparatus. In other examples, the data processing apparatus 200 outputs data useable to derive the encoded signal 210, for example an encrypted version of the encoded signal 210. The encoded signal 210 may be produced by a separate encoding device. The encoded signal may be an H.264-encoded signal.

In this example, the encoded signal 210 is decoded to produce a decoded signal 212 at the relatively low level of quality. The decoding operation may be performed to emulate a decoding operation that would be performed at the at least one further apparatus, for example a decoder. In some examples, the data processing apparatus 200 decodes the encoded signal 210 to produce the decoded signal 212. In other examples, the data processing apparatus 200 receives the decoded signal 212, for example from an encoding and/or decoding device that is separate from the data processing apparatus 200. The encoded signal may be decoded using an H.264 decoder. H.264 decoding results in a sequence of images (that is, a sequence of time samples of the signal) at the relatively low level of quality. The processing that follows is therefore performed on an image-by-image basis where the data processing apparatus 200 processes video signal data.

In this example, the data processing apparatus 200 obtains correction data 214 based on a comparison between the downsampled data 208 and the decoded signal 212. The data processing apparatus 200 may obtain the correction data 214 by generating or deriving the correction data 214 itself or by receiving the correction data 214 from one or more other entities. The correction data 214 can be used to correct for errors introduced in encoding and decoding the downsampled data 208. In some examples, the data processing apparatus 200 outputs the correction data 214, as well as the encoded signal 210, for example for transmission to at least one further apparatus. Providing the correction data 214 allows the recipient to correct for the errors introduced in encoding and decoding the downsampled data 208.

In this example, the data processing apparatus 200 corrects the decoded signal 212 using the correction data 214 to derive a representation 216 of the signal at the relatively low level of quality. The representation 216 of the signal at the relatively low level of quality will be referred to as "corrected downsampled data" hereinafter. In other examples, the data processing apparatus 200 uses the downsampled data 208 as the representation 216 of the signal at the relatively low level of quality without applying the correction data 214 to the decoded signal 212.

The data processing apparatus 200 obtains data 218 based on the corrected downsampled data 216. In this example, the data 218 is a second representation of the first time sample of the signal at the relatively high level of quality, the first representation of the first time sample of the signal at the relatively high level of quality being the input data 206. In this example, the data processing apparatus 200 derives the data 218 by performing an upsampling operation on the corrected downsampled data 216. The data 218 will be therefore referred to hereinafter as "upsampled data". However, in other examples one or more other operations could be used to derive the data 218, for example where data 216 is not derived by downsampling the input data 206.

The input data 206 and the upsampled data 218 are used to obtain residual data 220. The residual data 220 is associated with the first time sample, $t_1$, of the signal. The residual data 220 may be obtained by comparing the input data 206 with the upsampled data 218. The residual data 220 may be in the form of a set of residual elements. A residual element in the set of residual elements 220 is associated with a respective signal element in the input data 206. As such, the set of residual elements 220 is useable in combination with the upsampled data 218 to reconstruct the input data 206. The residual data 220 may also be referred to as "reconstruction data" or "enhancement data".

In some examples, the set of residual elements 220 is transformed into one or more further sets of data elements. The one or more further sets of data elements may comprise a set of correlation elements. The set of correlation elements may exploit correlation between residual elements in the set of residual elements 220. The set of correlation elements may be indicative of a result of a directional decomposition of the set of residual elements 220. Less data may be used to transmit the set of correlation elements than the set of residual elements 220, for example when there is a relatively strong extent of correlation between residual elements in the set of residual elements 220. The set of correlation elements is an example of a first set of data elements based on the first time sample, $t_1$, of the signal. In some examples, the set of correlation elements exploits temporal correlation between data based on the first time sample, $t_1$, of the signal and data based on one or more different, for example earlier, time samples of the signal. For example, the set of correlation elements may exploit temporal redundancies between the set of residual elements 220 that are associated with the first time sample, $t_1$, and one or more further sets of residual elements, each of the one or more further sets of residual elements being associated with a different, for example earlier, time sample. In some examples, the set of correlation elements is indicative of both an extent of correlation between residual elements in the set of residual elements 220 and an extent of temporal correlation based on one or more different, for example earlier, time samples.

For an example on how to transform residual data into directional components, the reader may refer to international patent application no. PCT/EP2013/059847, which relates to a directional decomposition of residual data during signal encoding, decoding and reconstruction in a tiered hierarchy. The entire contents of international patent application no. PCT/EP2013/059847 are incorporated herein by reference.

In this example, the data processing apparatus 200 outputs data based on the downsampled data 208, data based on the correction data 214, and data based on the residual data 220, for encoding and transmission to at least one further apparatus.

In this example, the data based on the correction data 214 comprises quantised correction data 222 generated by performing a quantisation on the correction data 214. In some examples, the data processing apparatus 200 performs the quantisation on the correction data 214. In other examples, one or more other entities perform the quantisation on the correction data 214. The quantisation on the correction data 214 may be performed using a first quantisation parameter 224. The first quantisation parameter 224 may be used as an input to determine a quantisation setting for quantising the correction data 214. The first quantisation parameter 224 may be indicative of a level, amount, granularity, step size and/or threshold associated with a quantisation operation. For example, a relatively high level of quantisation may correspond to a relatively large extent of compression. A relatively low quantisation level, on the other hand, may correspond to a relatively small extent of compression. The first quantisation parameter 224 is determined based on a derived measure of similarity between values of corresponding data elements in different data element sets.

In this example, the data based on the residual data 220 comprises quantised residual data 226. The quantised residual data 226 is generated by performing a quantisation on either the residuals 220 or on one or more further sets of data elements derived from the residuals 220. For example, quantisation may be performed on a set of correlation elements indicative of an extent of correlation between residuals in the set of residuals 220 and/or an extent of temporal correlation based on one or more different, for example earlier, time samples. In some examples, the quantisation is performed by the data processing apparatus 200. In other examples, the quantisation is performed by one or more other entities. The quantised residual data 226 may be generated using a second quantisation parameter 228. The second quantisation parameter 228 may be used as an input to determine a quantisation setting for quantising the residuals 220 or the one or more further sets of data elements derived from the residuals 220. In some examples, the first quantisation parameter 224 and the second quantisation parameter 228 have the same values as each other. In other examples, the first quantisation parameter 224 and the second quantisation parameter have different values from each other. In some examples, the first quantisation parameter 224 is independent of the second quantisation parameter 228. In other examples, there is a dependency between the first quantisation parameter 224 and the second quantisation parameter 228. The data processing apparatus 200 may be configured to determine one of the first quantisation parameter 224 and the second quantisation parameter 228 based on a predetermined relationship with the other of the first quantisation parameter 224 and the second quantisation parameter 228.

Data based on a group of signal time samples may be encoded in accordance with an overall bitrate target or budget for the group of signal time samples. Each of the time samples in the group may be allocated individual bitrates based on the overall bitrate budget. An allocated bitrate for a given time sample may correspond to an amount of data to be used to represent the given time sample. The allocated bitrate for a given time sample may be indicative of a measure of quality for the given time sample. For example, the allocated bitrate for a given time sample may be indicative of a measure of quality of a reconstructed representation of the given time sample of the signal. The reconstructed representation may be a reconstruction of input data 206 following one or more compression and decompression processes. For example, a relatively low bitrate may be indicative of a relatively low level of quality since fewer bits are allocated. Bitrate allocation may be considered to be a form of rate control.

The first quantisation parameter 224 and the second quantisation parameter 228 may be used to influence a bitrate allocation for a given time sample in the group of time samples. For example, data undergoing a relatively high level of quantisation may be allocated a relatively small amount of the overall bitrate. In the example shown in FIG. 2, the first quantisation parameter 224 and the second quantisation parameter 228 are used to influence a bitrate allocation for data based on the first time sample, $t.sub.1$, of a signal. In particular, the first quantisation parameter 224 is used to influence the bitrate allocation for correction data 214 and the second quantisation parameter 228 is used to influence the bitrate allocation for the residual data 220.

Several possible approaches may be used to allocate bitrate to a group of time samples.

In a first possible approach, the first quantisation parameter 224 and/or the second quantisation parameter 228 have the same values for all time samples in the group of time samples. Consequently, the same amount of bitrate may be allocated to each time sample in the group. For example, supposing an overall bitrate budget of 400 bits is available for a group of four time samples, each of the time samples would be allocated 100 bits. This may provide a relatively straightforward technique in terms of implementation since bitrate can be evenly allocated across all time samples in the group without any analysis of the individual analysis of the time samples being conducted. However, bitrate might be over-allocated to relatively unimportant time samples. This may result in inefficient use of the available bitrate. Additionally or alternatively, bitrate might be under-allocated to relatively important time samples, which could result in a loss in visual quality.

In a second possible approach, the first quantisation parameter 224 and/or the second quantisation parameter 228 are determined for a given time sample based on a category of the given time sample. Consequently, different amounts of bitrate may be allocated to different time samples in the group according to their respective categories, with the constraint that the sum of all the bitrates for the time samples in the group is equal to the overall bitrate budget for the group. For example, supposing an overall bitrate budget of 400 bits is available for a group of four time samples, the first time sample may be allocated 150 bits based on its categorisation, the second and third time samples may each be allocated 75 bits based on their categorisations and the fourth time sample may be allocated 100 bits based on its categorisation. This approach may involve additional processing compared to the first possible approach in that time sample categories are determined and the bitrates are allocated accordingly. However, this approach may facilitate uneven distribution of bitrates across the time samples, for example to reflect the different types of time sample. While this approach may result in a more fine-grained bitrate allocation, it relies on categorisation of individual time samples. Furthermore, allocating bitrate based on categorisation in this way might not reflect the objective importance of the individual time samples in the group.

In a third possible approach, instead of considering a given time sample in isolation based on its categorisation, as is the case in the second approach described above, other time samples are also considered in order to assess the relative importance of the given time sample. In this approach, bitrate may be allocated to a given time sample based on its relative importance compared to other time samples in the group of time samples. Time samples that are relatively important may be allocated a relatively large amount of the overall bitrate for the group and time samples that are relatively unimportant may be allocated a relatively small amount of the overall bitrate for the group. For example, supposing an overall bitrate budget of 400 bits is available for a group of four time samples, the first time sample may be allocated 350 bits based on a determination that it is the most important time sample in the group, the second time sample may be allocated 30 bits based on a determination that it is the second most important time sample in the group, the third time sample may be allocated 15 bits based on a determination that it is the third most important time sample in the group and the fourth time sample may be allocated 5 bits based on a determination that it is the least important time sample in the group. By taking into account the relative importance of the time samples, the bitrate may be allocated more effectively across the time samples in the group.

In the examples that follow, a first time sample of a signal is analysed, along with one or more later time samples, in order to determine a degree of influence of the first time sample over the one or more later time samples. The first quantisation parameter 224 and/or the second quantisation parameter 228 may be derived based on such an analysis. Accordingly, data derived based on a time sample that has a relatively high degree of influence may be allocated more bitrate than data derived based on a time sample that has a relatively low degree of influence. This enables bitrate allocation to be performed in a more dynamic and intelligent manner Consequently, inefficient use of bitrate may be reduced and visual quality may be improved.

Figure 3:
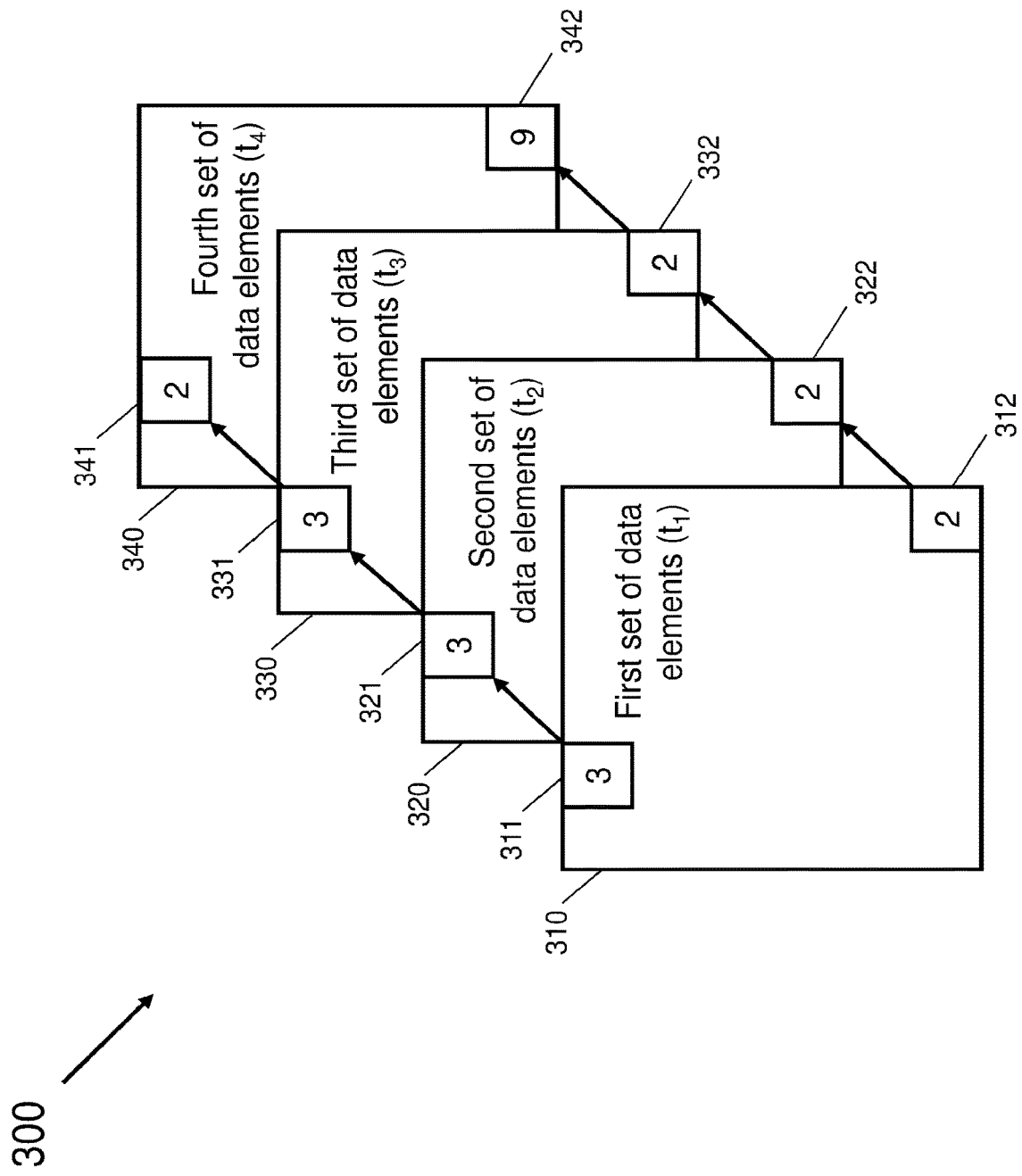
FIG. 3 shows a schematic block diagram of an example of a group of time samples of a signal in accordance with an embodiment of the present invention.

Referring to FIG. 3, there is shown schematically an example of a group 300 of data element sets. Each set of data elements in the group 300 is based on a different time sample of a signal. The group of data element sets 300 may be obtained by a data processing apparatus such as data processing apparatus 200. The group of data element sets 300 may correspond to a sequence of images comprised in a video signal. For example, a given set of data elements in the group 300 may be based on a set of pixels comprised in a given image that forms part of the video.

The group 300 comprises a first set of data elements 310. The first set of data elements 310 is based on a first time sample, $t_1$, of the signal. The first set of data elements 310 may comprise signal data corresponding to the first time sample, $t_1$, of the signal. In some examples, the first set of data elements 310 comprises data obtained by processing the first time sample, $t_1$, of the signal. The first set of data elements 310 may comprise reconstruction data corresponding to the first time sample, $t_1$, of the signal. The first set of data elements 310 may be based on the input data 206. In some examples, the first set of data elements 310 is based on a set of residual elements such as the set of residual elements 220. In some examples, the first set of data elements 310 comprises a set of residual elements. In some examples, the first set of data elements 310 comprises a set of correlation elements indicative of an extent of correlation between a set of residual elements. The first set of data elements 310 comprises at least a first data element 311 and a second data element 312, it being understood that many more data elements may be comprised in a set of data elements. In this example, the first data element 311 has a value of 3 and the second data element has a value of 2. Although in this example the values are decimal, numerical values, in other examples the values of the first data element 311 and the second data element 312 may be symbols, binary values, functions, codes or any other type of data.

As such, data processing apparatus 200 obtains a first value of a first data element 311 in a first set of data elements 310. In some examples, obtaining the value comprises receiving the value from at least one other entity. In some examples, obtaining the value comprises receiving data useable to derive the value. In some examples, obtaining the value comprises deriving or generating the value, for example using one or more inputs and/or processing steps.

The group 300 further comprises a second set of data elements 320. The second set of data elements 320 is based on a second time sample, $t_2$, of the signal. In some examples, the second set of data elements 320 comprises data obtained by processing the second time sample, $t_2$, of the signal. The second set of data elements 320 may comprise reconstruction data corresponding to the second time sample, $t_2$, of the signal. For example, the second set of data elements 320 may comprise a set of residual elements. In some examples, the second set of data elements 320 comprises a set of correlation elements indicative of an extent of correlation between a set of residual elements. The second time sample, $t_2$, is a later time sample relative to the first time sample, $t_1$. In some examples, a later time sample means a time sample that follows the first time sample, $t_1$, in the input data. The second time sample, $t_2$, may be an immediately following time sample in relation to the first time sample, $t_1$. In some examples, the second time sample, $t_2$, is a later time sample relative to the first time sample, $t_1$, but not an immediately following time sample relative to the first time sample, $t_1$.

The second set of data elements 320 comprises at least a first data element 321 and a second data element 322. The first data element 321 is in the same position in the second set of data elements 320 as the position of the first data element 311 in the first set of data elements 310. The second data element 322 is also in the same position in the second set of data elements 320 as the position of the second data element 312 in the first set of data elements 310.

As such, the data processing apparatus 200 obtains a value of a data element in a second set of data elements 320.

The first data element 321 in the second set of data elements 320 is compared with the first data element 311 in the first set of data elements 310. A measure of similarity between the value of the first data element 311 in the first set of data elements 310 and the value of the first data element 321 in the second set of data elements 320 is derived. The measure of similarity indicates how similar the value of the first data element 311 in the first set of data elements 310 and the value of the first data element 321 in the second set of data elements 320 are. The measure of similarity may be binary. For example, the measure of similarity may indicate whether or not the values are deemed sufficiently similar. In other examples, the measure of similarity is non-binary. For example, the measure of similarity may provide a more detailed indication of an extent of similarity. For example, the measure of similarity may be a value that increments in 0.1 interval steps in the range 0.0 to 1.0. A measure of similarity of 1.0 may for example indicate that the values being compared are identical.

Deriving the measure of similarity may involve determining whether a difference between the two values is below a predetermined threshold. The difference may be the absolute value of the difference between the value of the first data element 311 in the first set of data elements 310 and the value of the first data element 321 in the second set of data elements 320. In some examples, the predetermined threshold is zero. In other words, the measure of similarity may comprise determining whether the two values are equal. In other examples, the predetermined threshold is non-zero. In other words, the measure of similarity may comprise determining whether the two values differ by less than a threshold amount.

As such, the data processing apparatus 200 derives a measure of similarity between the value of the first data element 311 in the first set of data elements 310 and the value of the corresponding data element 321 in the second set of data elements 320.

In this example, the value of the first data element 311 in the first set of data elements 310 and the value of the first data element 321 in the second set of data elements 320 are both 3. The values are therefore be considered to be sufficiently similar, regardless of whether the predetermined threshold is zero or non-zero. In response to the two values being deemed sufficiently similar, a similarity score for the first data element 311 in the first set of data elements 310 is incremented from 0 to 1. The similarity score indicates an extent of persistence of the value of the first data element 311 from the first set of data elements 310 across subsequent sets of data elements. For example, time samples of a video with relatively static content are likely to obtain a higher persistence score than time samples of a video with relatively dynamic content.

A similar comparison may be performed between the second data element 312 in the first data element set 310 and the second data element 322 in the second data element set 320, both of which have a value of 2. Therefore a similarity score for the second data element 312 in the first set of data elements 310 is also incremented from 0 to 1, regardless of whether the predetermined threshold is zero or non-zero.

In the example shown in FIG. 3, a value of an individual data element in the first data element set 310 is compared with a value of an individual data element in the second data element set 320. In other examples, values of a group comprising a plurality of data elements in the first data element set 310 are compared with values of a corresponding group comprising a plurality of data elements in the second data element set 320. A similarity score may be determined for the group of data elements.

In the example shown in FIG. 3, the position of the first data element 311 in the first set of data elements 310 is the same as the position of the first data element 321 in the second set of data elements 320. In other examples, the position of the first data element 311 in the first set of data elements 310 is allowed to be different from the position of the first data element 321 in the second set of data elements 320. Such other examples may be used where data elements, or groups of data elements, move between different time samples of a signal but retain the same or sufficiently similar values.

The group 300 further comprises a third set of data elements 330. The third set of data elements 330 is based on a third time sample, $t_3$, of the signal. The third time sample, $t_3$, is a later time sample relative to both the first time sample, $t_1$, and the second time sample, $t_2$. The third set of data elements 330 comprises at least a first data element 331 and a second data element 332. The values of the first and second data elements 331, 332 in the third set of data elements 330 are also obtained.

In a similar manner to that described above, the first data element 331 in the third data element set 330 is compared with one or both of the first data element 311 in the first data element set 310 and the first data element 321 in the second data element set 320. In this example, the value of the first data element 331 in the third data element set 330 is the same as the values of the first data element 311 in the first data element set 310 and the first data element 321 in the second data element set 320. Therefore, the similarity score for the first data element 311 in the first data element set 310 is incremented from 1 to 2, regardless of whether the predetermined threshold is zero or non-zero. The value of the first data element 331 in the third data element set 330 could be compared to the value of the first data element 311 in the first data element set 310 to determine whether the similarity score for the first data element 311 should be incremented. Alternatively or additionally, the value of the first data element 331 in the third data element set 330 could be compared to the value of the first data element 321 in the second data element set 320 to determine whether the similarity score for the first data element 311 should be incremented.

Correspondingly, the second data element 332 in the third data element set 330 is compared with one or both of the second data element 312 in the first data element set 310 and the second data element 322 in the second data element set 320. Since the value of the second data element 332 in the third data element set 330 is the same as the values of the second data element 312 in the first data element set 310 and the second data element 322 in the second data element set 320, the similarity score for the second data element 312 in the first data element set 310 is incremented from 1 to 2, regardless of whether the predetermined threshold is zero or non-zero.

The group 300 further comprises a fourth set of data elements 340. The fourth set of data elements 340 is based on a fourth time sample, $t_4$, of the signal. The fourth time sample, $t_4$, is a later time sample relative to each of the first time sample, $t_1$, the second time sample, $t_2$, and the third time sample, $t_3$. The fourth set of data elements 340 comprises at least a first data element 341 and a second data element 342. The values of the first and second data elements 341, 342 in the further set of data elements 340 are also obtained.

In a similar manner to that described above, the first data element 331 in the third data element set 340 is compared with one or more of the first data element 311 in the first data element set 310, the first data element 321 in the second data element set 320, and the first data element 331 in the third data element set 330. In this example, the value of the first data element 341 in the fourth set of data elements 340 is 2, which is not equal to the values of the first data elements 311, 321, 333 in the first, second and third sets of data elements 310, 320, 330.

In some examples, a non-zero predetermined difference threshold is used. If the difference threshold is 2, in other words if values which have a difference of less than or equal to 2 are deemed to be sufficiently similar, the similarity score for the first data element 311 in the first set of data elements 310 is incremented from 2 to 3. If the difference threshold is 1, in other words if values which have a difference of less than or equal to 1 are deemed to be sufficiently similar, the similarity score for the first data element 311 in the first set of data elements 310 is likewise be incremented from 2 to 3.

In some examples, a zero predetermined difference threshold is used. If the difference threshold is 0, in other words if only values which are equal are deemed to be sufficiently similar, the similarity score for the first data element 311 in the first set of data elements 310 is maintained, i.e. is not incremented, and retains the value of 2.

In this example, the value of the second data element 342 in the fourth set of data elements 340, 9, is not equal to the values of the second data elements 312, 322, 332 in the first, second and third sets of data elements 310, 320, 330.

Since the difference between the value of the second data element 342 in the fourth set of data elements 340 and the values of the second data element 312, 322, 332 in the first, second and third sets of data elements 310, 320, 330 is 7, regardless of whether the difference threshold is 2, 1 or 0, the similarity score for the second data element 312 in the first set of data elements 310 would not be incremented and would retain a value of 2.

One or more further sets of data elements (not shown) may be analysed with respect to the first data element 311 in the first data element set 310 if the similarity score for the first data element 311 was incremented to a value of 3. The similarity score for the first data element 311 may be further incremented until the value of the first data element 311 no longer persists in a further set of data elements. However, since the value of the second data element 312 in the first set of data elements 310 does not persist in the fourth set of data elements 340, in this example the one or more further sets of data elements are not analysed with respect to the second data element 312 in the first set of data elements 310.

By repeating the above process for other data elements in the first set of data elements 310, a similarity score for each data element in the first set of data elements 310 may be generated. Each similarity score may indicate how the value of a particular data element persists across subsequent sets of data elements.

An overall similarity score may be obtained for the first set of data elements 310 by combining, for example adding or averaging, the similarity scores for each data element in the first set of data elements 310. The overall similarity score may indicate how values of data elements from the first set of data elements 310 persist across subsequent sets of data elements. Different overall similarity scores may be obtained for different sets of data elements and may be compared with each other to determine at least one quantisation factor.

As such, the apparatus 200 determines at least one quantisation parameter based on a derived measure of similarity between a first value of a first data element 311 in a first set of data elements 310 and a second value of a corresponding data element 321 in a second set of data elements 320. The at least one quantisation parameter may comprise a single quantisation parameter. The at least one quantisation parameter may comprise a plurality of quantisation parameters. The at least one quantisation parameter may indicate one or more levels of quantisation. The at least one quantisation parameter is useable in performing quantisation on data based on the first time sample, $t_1$, of the signal. The data based on the first time sample, $t_1$, of the signal may comprise the first set of data elements 310. In some examples, the at least one quantisation parameter comprises a first quantisation parameter and a second quantisation parameter. The first quantisation parameter may be useable in performing quantisation on data at a relatively low level of quality in a tiered hierarchy having multiple levels of quality. The data at the relatively low level of quality may comprise correction data such as correction data 214. The second quantisation parameter may be useable in performing quantisation on data at a relatively high level of quality in the tiered hierarchy. The data at the relatively high level of quality may comprise data based on residual data, such as residual data 210. Determining the at least one quantisation parameter may comprise selecting at least one quantisation parameter from a predetermined set of possible quantisation parameters. In some examples, determining the at least one quantisation parameter comprises generating or deriving the at least one quantisation parameter.

The data processing apparatus 200 generates output data using the at least one quantisation parameter. In some examples, the output data comprises the at least one quantisation parameter or data useable to derive the at least one quantisation parameter. In such examples, the output data may be transmitted to one or more further entities to enable the one or more further entities to perform quantisation using the at least one quantisation parameter. In some examples, the output data comprises quantised data or data useable to derive the quantised data. The quantised data may be generated by performing at least one quantisation operation using the at least one quantisation parameter. In other words, the data processing apparatus 200 may perform quantisation on the data based on the first time sample of the signal.

Figure 4:
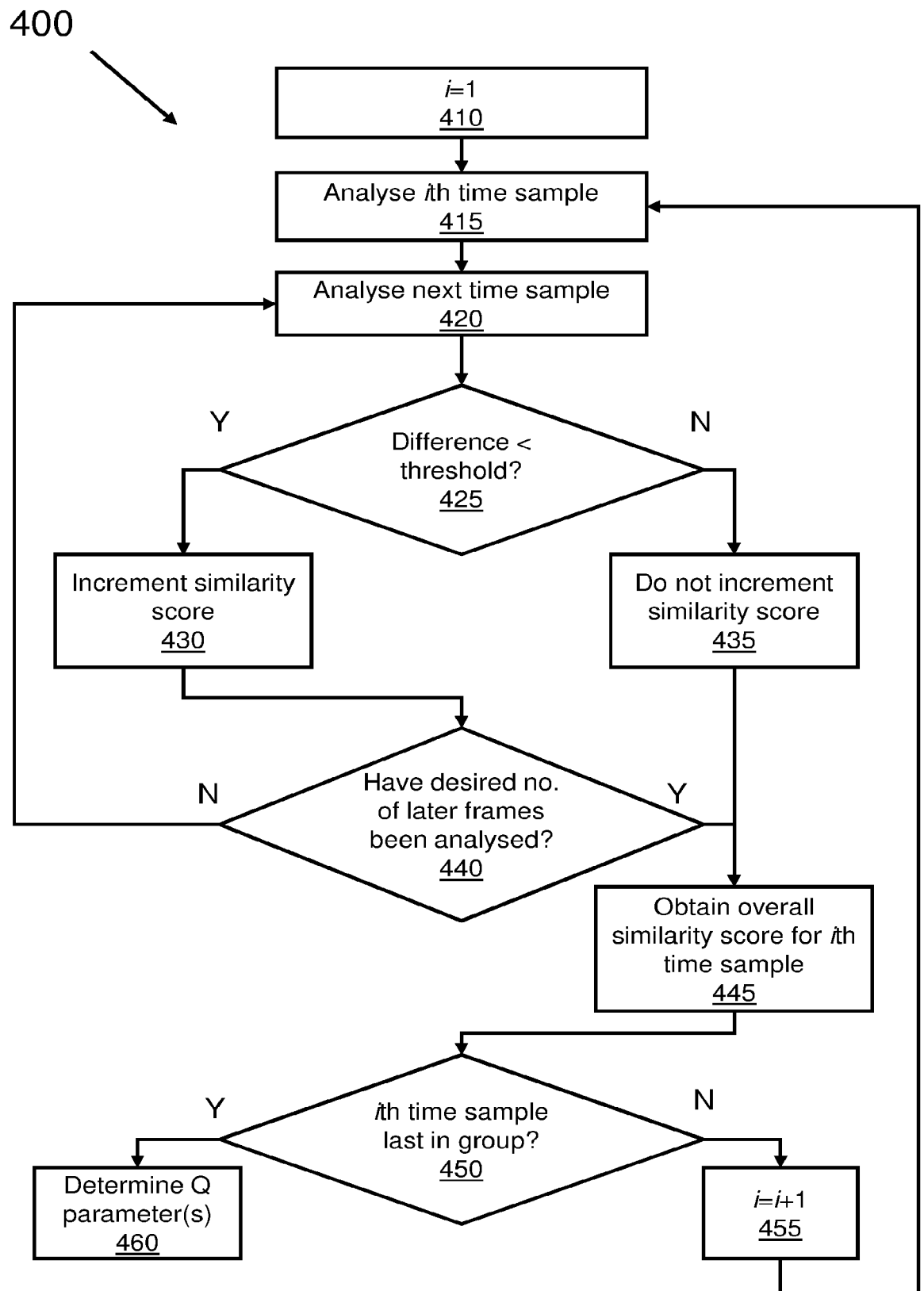
FIG. 4 shows a flow diagram depicting an example of a method in accordance with an embodiment of the present invention.

Referring to FIG. 4, there is shown an example of a method 400 of processing data. The method 400 may be performed by an apparatus such as apparatus 102 or apparatus 200 described above.

At item 410, an index, i, is set to 1. i indicates an index of a given time sample of a signal in a group of time samples of the signal for which a similarity score is to be determined. The group of time samples may correspond to a group of time samples across which a certain bitrate is to be distributed.

At item 415, the ith time sample in the group of time samples is analysed. Analysing the ith time sample may comprise obtaining values of at least some data elements in an ith set of data elements, the ith set of data elements being based on the ith time sample. The ith set of data elements comprises at least a first data element.

At item 420, if the ith time sample is not the last time sample in the group of time samples, a next time sample in the group of time samples is analysed. The next time sample may be the time sample immediately following the ith time sample, for example the (i+1)th time sample. Analysing the (i+1)th time sample may comprise obtaining values of at least some data elements in an (i+1)th set of data elements, the (i+1)th set of data elements being based on the (i+1)th time sample. The (i+1)th set of data elements comprises at least a second data element.

At item 425, a measure of similarity between the first data element and the second data element is derived. As described above, the measure of similarity may be derived in accordance with a predetermined difference threshold. If the difference between the value of the first data element and the value of the second data element is less than the threshold, the first data element and the second data element are deemed to be sufficiently similar. If the difference between the value of the first data element and the value of the second data element is greater than or equal to the threshold, the first data element and the second data element are deemed not to be sufficiently similar.

If it is determined at item 425 that the first data element and the second data element are sufficiently similar, a similarity score for the first data element is incremented at item 430.

If it is determined at item 425 that the first data element and the second data element are not sufficiently similar, the similarity score for the first data element is not incremented at item 435.

If the similarity score for the first data element is incremented at item 430, it is determined at item 440 whether a desired number of later time samples have been analysed. In some examples, the desired number of later time samples is less than the number of time samples in the group of time samples. In other words, only some of the time samples in the group of time samples are analysed. In some examples, the desired number of later time samples comprises a difference between the total number of time samples in the group of time samples and the index i. Consequently, in such examples, as i increases, the number of later time samples to be analysed decreases. In some examples, the desired number of later time samples is a constant. In such examples, the time samples to be analysed may therefore be considered as a "sliding window", which moves through the group of time samples as i increases. In some examples, the desired number of later samples is the lowest of a constant and the difference between the total number of time samples in the group and i. Thus, for some values of i, the desired number of later samples may be a constant, and for other values of i, the desired number of later time samples may be the difference between the total number of time samples in the group and i. In this example, time samples that are not part of the group of time samples are not analysed. In other examples, however, time samples that are not part of the group of time samples are analysed. For example, if the desired number of later time samples is kept constant, then when i increases, time samples outside of the group, for example in a subsequent group of time samples, may be analysed.

If it is determined at item 440 that the desired number of later time samples have not been analysed, the method returns to item 420, where a next time sample, for example the (i+2)th time sample, is analysed, and the above processes of comparison and incrementation are repeated.

If it is determined at item 440 that the desired number of later time samples have been analysed, or if the similarity score for the first data element is not incremented at item 435, an overall similarity score for the ith time sample is obtained at item 445. The overall similarity score for the ith time sample is indicative of an extent of dependence of one or more subsequent time samples on the ith time sample. Obtaining the overall similarity score may comprise repeating items 415 to 440 for one or more further data elements in the first set of data elements. In other words, a plurality of similarity scores may be obtained for a plurality of data elements in the first set of data elements. In some examples, generating the overall similarity score for the ith time sample involves combining the plurality of similarity scores, each of the plurality of similarity scores being associated with a different data element in the first set of data elements.

At item 450, it is determined whether the ith time sample is the last time sample in the group of time samples.

If it is determined at item 450 that the ith time sample is not the last time sample in the group of time samples, i is incremented at item 455 and the method returns to item 415. Items 415 to 450 are then repeated such that a plurality of overall similarity scores are generated, each of the plurality of overall similarity scores being associated with a different time sample in the group of time samples.

If it is determined at item 450 that the ith time sample is the last time sample in the group of time samples, at least one quantisation parameter is determined at 460. The at least one quantisation parameter is determined based on the plurality of overall similarity scores for the group of time samples. As such, the at least one quantisation parameter is determined based on the measure of similarity derived at item 425. The at least one quantisation parameter is useable in performing quantisation on data based on the first time sample of the group of time samples.

Figure 5:
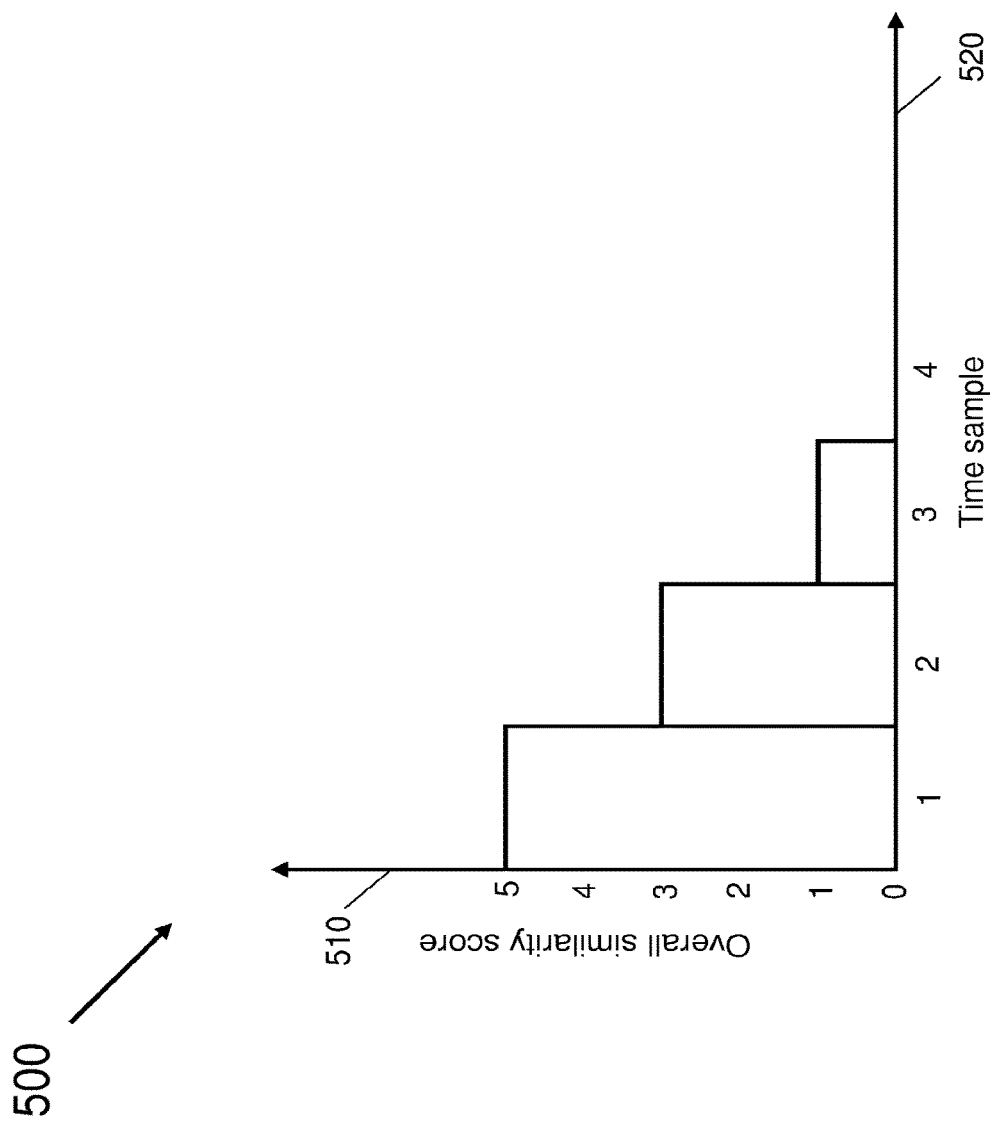
FIG. 5 shows a graph of an overall similarity score against time sample in accordance with an embodiment of the present invention.

Referring to FIG. 5, there is shown an example of a graph 500 showing overall similarity scores for a group of time samples of a signal. The group of time samples corresponds to the group of time samples 300 described with reference to FIG. 3 above.

Overall similarity scores are shown on the y axis 510 and a time sample index is shown on the x axis 520. Each bar corresponds to a different time sample in the group of time samples. The group of time samples may be subject to an overall bitrate target or constraint for performing an encoding on the group of time samples. An overall similarity score for each time sample may be obtained using a method such as that described with reference to FIG. 4 above. In some examples, the overall similarity scores for the group of time samples are normalised, for example by dividing each overall similarity score by the largest overall similarity score in the group. The overall similarity score for a given time sample is indicative of an extent of persistence of data element values from the given time sample to subsequent time samples. In other words, an overall similarity score is a measure of influence of a given time sample on subsequent time samples.

In this example, the group of time samples comprises 4 time samples. The first time sample in the group of time samples has an overall similarity score of 5. The second time sample in the group of time samples has an overall similarity score of 3. The third time sample in the group of time samples has an overall similarity score of 1. The fourth time sample in the group of time samples has an overall similarity score of 0. Thus, the first time sample in the group of time samples has the highest overall similarity score. This is because values of data elements based on the first time sample are repeated in data elements based on subsequent time samples. Transmission of repeated values in subsequent time samples may require less data, or may not be required at all, compared to transmission of different values. Therefore, less bitrate can be allocated to these "influenced" time samples compared to "influential" time samples. Since the first time sample has the highest overall similarity score of the group of time samples, it is considered to be the most influential time sample in the group. Therefore, the first time sample is allocated more bitrate than the other time samples in the group.

In order to allocate more bitrate to the first time sample than the other time samples, at least one quantisation parameter is determined for the first time sample. The at least one quantisation parameter is determined based on the plurality of overall similarity scores. The at least one quantisation parameter indicates one or more levels of quantisation and is useable in performing quantisation on data based on the first time sample. In some examples, the level of quantisation indicated by the at least one quantisation parameter is inversely proportional to the degree of influence of the first time sample on subsequent time samples. In other words, the more influential the first time sample is on subsequent time samples, the lower the level of quantisation indicated by the at least one quantisation parameter. Thus, a greater amount of information may be used to represent more influential time samples compared to less influential time samples. An efficient, analytical method of allocating bitrate across a group of time samples is thereby provided.

In some examples, at least one further quantisation parameter is determined. The at least one further quantisation parameter is useable in performing quantisation on data based on at least one other time sample in the group of time samples. Further output data may be generating using the at least one further quantisation parameter. In this example, the first time sample has the highest overall similarity score, and is therefore given at least one quantisation parameter indicative of a lowest level of quantisation. The second time sample has the second highest overall similarity score, and is therefore given at least one quantisation parameter indicative of a second lowest level of quantisation, etc.

Figure 6:
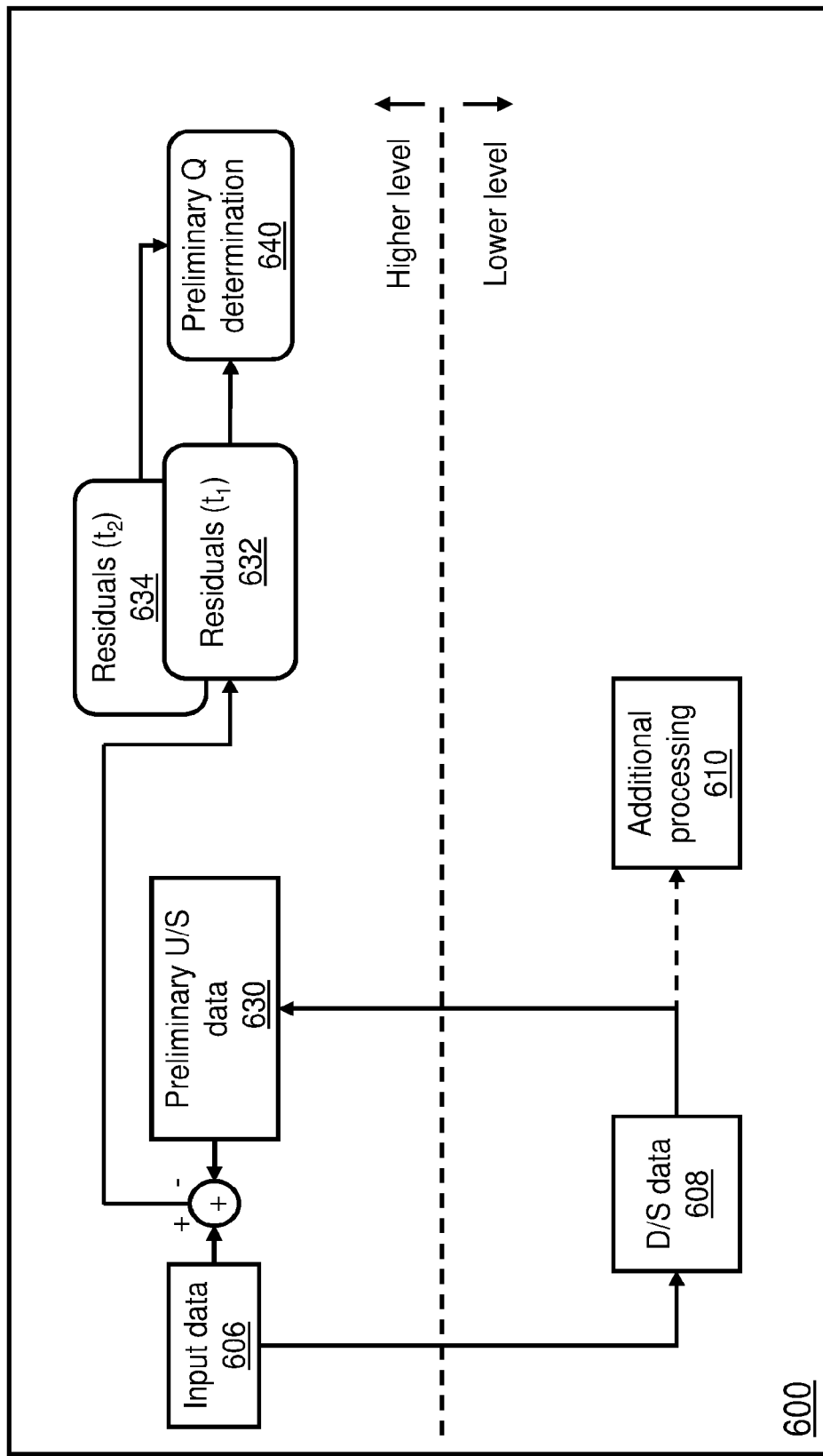
FIG. 6 shows a schematic block diagram of another example of an apparatus in accordance with an embodiment of the present invention.

Referring to FIG. 6, there is shown schematically an example of a data processing apparatus 600. The data processing apparatus 600 may comprise an encoder device. Some items depicted in FIG. 6 are similar to items shown in FIG. 2. Corresponding reference signs, incremented by 400, have therefore been used for similar items. In the data processing apparatus 600, items are shown on two logical levels. Items on the first, higher logical level relate to data at a relatively high level of quality. Items on the second, lower logical level relate to data at a relatively low level of quality. The relatively high and relatively low levels of quality are part of a tiered hierarchy having multiple levels of quality.

The data processing apparatus 600 obtains input data 606 at the relatively high level of quality. The input data 606 comprises a first representation of a first time sample, $t_{.sub.1}$, of a signal at the relatively high level of quality. The data processing apparatus 600 uses the input data 606 to derive downsampled data 608 at the relatively low level of quality, for example by performing a downsampling operation on the input data 606.

In some examples, the data processing apparatus 600 performs additional processing 610 on the downsampled data 608. As described with reference to FIG. 2 above, such additional processing 610 may involve encoding the downsampled data 608 to produce encoded data, decoding the encoded data to produce decoded data, obtaining correction data by comparing the downsampled data 608 with the decoded data, applying the correction data to the decoded data to obtain corrected data, and upsampling the corrected data to derive a second representation of the first time sample, $t_{.sub.1}$, of the signal at the relatively high level of quality.

In this example, separately to the additional processing 610, the data processing apparatus 600 uses the downsampled data 608 to derive a preliminary second representation 630 of the first time sample, $t_{.sub.1}$, of the signal at the relatively high level of quality. The preliminary second representation 630 at the relatively high level of quality may be derived by performing an upsampling operation on the downsampled data 608. The preliminary second representation 630 at the relatively high level of quality is referred to hereinafter as "preliminary upsampled data" because it is derived without performing the encoding, decoding and correcting steps that are used to derive upsampled data 218 as described above with reference to FIG. 2. Deriving the preliminary upsampled data 630 may be a relatively fast process compared to deriving the upsampled data 218 since the additional processing 610 is not conducted to obtain the preliminary upsampled data 630. The latency in obtaining upsampled data is therefore reduced by deriving the preliminary upsampled data 630 compared to deriving the upsampled data 218.

The data processing apparatus 600 obtains a first set of residual elements 632 associated with the first time sample, $t_{.sub.1}$, of the signal. The first set of residual elements 632 is obtained by comparing the preliminary upsampled data 630 with the input data 606. A residual element in the first set of residual elements 632 is associated with a respective signal element in the input data 606. The first set of residual elements 632 is an example of a first set of data elements based on the first time sample, $t_{.sub.1}$, of the signal.

The data processing apparatus 600 obtains a second set of residual elements 634 associated with a second time sample, $t_{.sub.2}$, of the signal. In some examples, the second time sample, $t_{.sub.2}$, of the signal immediately follows the first time sample, $t_{.sub.1}$, in the signal. The second set of residual elements 634 may be obtained using a similar method to that used to obtain the first set of residual elements 632, namely by producing a preliminary second rendition of the second time sample, $t_{.sub.2}$, of the signal at the relatively high level of quality. The second set of residual elements 634 is an example of a second set of data elements based on the second time sample, $t_{.sub.2}$, of the signal.

The data processing apparatus 600 uses the first set of residual elements 632 and the second set of residual elements 634 to determine a preliminary quantisation parameter 640. The preliminary quantisation parameter 640 may be determined based on a measure of similarity between a first value of a first residual element in the first set of residual elements 632 and a second value of a second residual element in the second set of residual elements 634. The preliminary quantisation parameter 640 is useable to perform quantisation on data based on the first time sample, $t_{.sub.1}$, of the signal. In some examples, the preliminary quantisation parameter 640 is used as the at least one quantisation parameter 224, 228 described above with reference to FIG. 2. The data processing apparatus 600 may be configured to perform the quantisation on the data based on the first time sample, $t_{.sub.1}$, of the signal. In other words, the preliminary quantisation parameter 640 may be used to generate quantised correction data 222 and/or quantised residual data 226 as part of the additional processing 610. In other examples, the preliminary quantisation parameter 640 is used to perform a preliminary quantisation on the data based on the first time sample, $t_{.sub.1}$, of the signal. The at least one quantisation parameter 224, 228, which is obtained by the additional processing 610, is then used to adjust the quantisation on the data based on the first time sample, $t_{.sub.1}$, of the signal. Since the preliminary quantisation parameter 640 is determined without performing encoding and decoding at the lower level of quality, it may be obtained relatively quickly compared to a case in which encoding and decoding at the lower level of quality are performed prior to obtaining a quantisation parameter. The preliminary quantisation parameter 640 may therefore be used to quantile the correction data 222 and/or residual data 226 sooner than would be possible if a quantisation parameter determined based on the residual data 226 were used. Although the preliminary quantisation parameter 640 is derived based on preliminary upsampled data that does not take account of the effect of the encoding and decoding at the relatively low level of quality, the upsampled data generated as part of the additional processing 610 is likely to be similar to the preliminary upsampled data. This is because the upsampled data generated as part of the additional processing 610 has been corrected to account for errors introduced during the encoding and decoding process on the relatively low level, or because the encoding and decoding process on the relatively low level has not introduced any or has introduced very few errors. As such, the preliminary quantisation parameter 640 may represent a sufficiently good approximation of the quantisation parameter that would subsequently be obtained via the additional processing 610.

Figure 7:
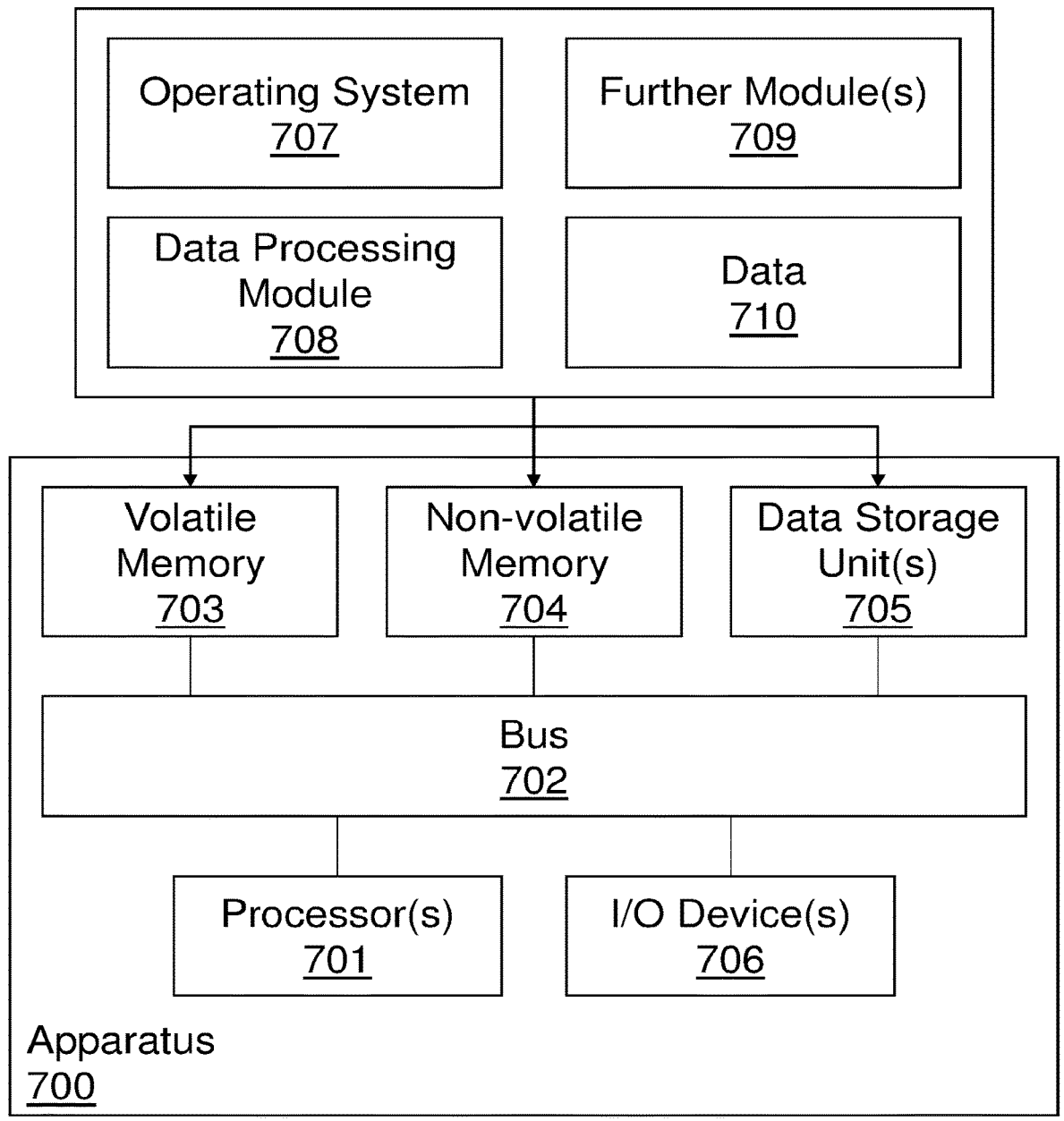
FIG. 7 shows a schematic block diagram of another example of an apparatus in accordance with an embodiment of the present invention.

Referring to FIG. 7, there is shown a schematic block diagram of an example of an apparatus 700.

In an example, the apparatus 700 comprises an encoder device. In another example, the apparatus 700 is able to communicate with an encoder device.

Other examples of apparatus 700 include, but are not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, mobile device, video game console, handheld video game device, a peripheral device such as a switch, modem, router, etc., or in general any type of computing or electronic device.

In this example, the apparatus 700 comprises one or more processors 701 configured to process information and/or instructions. The one or more processors 701 may comprise a central processing unit (CPU). The one or more processors 701 are coupled with a bus 702. Operations performed by the one or more processors 701 may be carried out by hardware and/or software. The one or more processors 701 may comprise multiple co-located processors or multiple disparately located processors.

In this example, the apparatus 700 comprises computer-useable volatile memory 703 configured to store information and/or instructions for the one or more processors 701. The computer-useable volatile memory 703 is coupled with the bus 702. The computer-useable volatile memory 703 may comprise random access memory (RAM).

In this example, the apparatus 700 comprises computer-useable non-volatile memory 704 configured to store information and/or instructions for the one or more processors 701. The computer-useable non-volatile memory 704 is coupled with the bus 702. The computer-useable non-volatile memory 704 may comprise read-only memory (ROM).

In this example, the apparatus 700 comprises one or more data-storage units 705 configured to store information and/or instructions. The one or more data-storage units 705 are coupled with the bus 702. The one or more data-storage units 705 may for example comprise a magnetic or optical disk and disk drive or a solid-state drive (SSD).

In this example, the apparatus 700 comprises one or more input/output (I/O) devices 706 configured to communicate information to and/or from the one or more processors 701. The one or more I/O devices 706 are coupled with the bus 702. The one or more I/O devices 706 may comprise at least one network interface. The at least one network interface may enable the apparatus 700 to communicate via one or more data communications networks. Examples of data communications networks include, but are not limited to, the Internet and a Local Area Network (LAN). The one or more I/O devices 706 may enable a user to provide input to the apparatus 700 via one or more input devices (not shown). The one or more input devices may include for example a remote control, one or more physical buttons etc. The one or more I/O devices 706 may enable information to be provided to a user via one or more output devices (not shown). The one or more output devices may for example include a display screen.

Various other entities are depicted for the apparatus 700. For example, when present, an operating system 707, data processing module 708, one or more further modules 709, and data 710 are shown as residing in one, or a combination, of the computer-usable volatile memory 703, computer-usable non-volatile memory 704 and the one or more data-storage units 705. The data processing module 708 may be implemented by way of computer program code stored in memory locations within the computer-usable non-volatile memory 704, computer-readable storage media within the one or more data-storage units 705 and/or other tangible computer-readable storage media. Examples of tangible computer-readable storage media include, but are not limited to, an optical medium (e.g., CD-ROM, DVD-ROM or Blu-ray), flash memory card, floppy or hard disk or any other medium capable of storing computer-readable instructions such as firmware or microcode in at least one ROM or RAM or Programmable ROM (PROM) chips or as an Application Specific Integrated Circuit (ASIC).

The apparatus 700 may therefore comprise a data processing module 708 which can be executed by the one or more processors 701. The data processing module 708 can be configured to include instructions to implement at least some of the operations described herein. During operation, the one or more processors 701 launch, run, execute, interpret or otherwise perform the instructions in the data processing module 708.

Although at least some aspects of the examples described herein with reference to the drawings comprise computer processes performed in processing systems or processors, examples described herein also extend to computer programs, for example computer programs on or in a carrier, adapted for putting the examples into practice. The carrier may be any entity or device capable of carrying the program.

It will be appreciated that the apparatus 700 may comprise more, fewer and/or different components from those depicted in FIG. 7.

The apparatus 700 may be located in a single location or may be distributed in multiple locations. Such locations may be local or remote.

The techniques described herein may be implemented in software or hardware, or may be implemented using a combination of software and hardware. They may include configuring an apparatus to carry out and/or support any or all of techniques described herein.

The above embodiments are to be understood as illustrative examples. Further embodiments are envisaged.

In examples described above, the first time sample, $t_1$, and the second time sample, $t_2$, are both time samples of the same signal. In other examples, the first time sample, $t_1$, and the second time sample, $t_2$, are time samples of different signals. For example, if the signals are video signals, the first time sample, $t_1$, may correspond to a last frame of a first video signal and the second time sample, $t_2$, may correspond to a first frame of a subsequent video signal.

In examples described above, a similarity score is determined by looking at a similarity between a corresponding data elements in successive sets of data elements by starting at the first set and finishing at the final set. In other examples, the similarity score could be determined in another way, for example by starting at the final set and working backwards to the first set. For example, the final and penultimate sets could be analysed together to determine a similarity score, and so on until the second set and first set have been analysed. Where corresponding data elements in adjacent sets are not considered to be sufficiently similar, a similarity score for the data elements concerned could be reset and restarted once corresponding data elements in adjacent sets are considered to be sufficiently similar.

In examples described above, the data processing apparatus 200 encodes and decodes the downsampled data 208 to produce correction data 214 or corrected downsampled data 216. In some examples, the data processing apparatus 200 does not encode and decode the downsampled data 208 and does not produce correction data 214. In such examples, the data processing apparatus 200 uses the downsampled data instead of the corrected downsampled data 216.

In examples described above, data element sets corresponding to a group of signal time samples are analysed on an element-by-element basis. In other words, a first data element in a first data element set is compared with a corresponding data element in a second data element set, a corresponding data element in a third data element set, and so on, until the value of the first data element no longer persists. A second data element in the first data element set is then compared with corresponding data elements in one or more other data element sets. By analysing data element sets on an element-by-element basis, less data may be processed than if all data elements in a first set were compared to those in a second set and then all of those in a third set etc., thereby making bitrate allocation more efficient. For example, if it is determined that a value of a given data element no longer persists, a corresponding data element in a further set of data elements is not obtained. Only the parts of further data element sets that correspond to data elements whose values persist are obtained. In other examples, data element sets are analysed on a set-by-set basis instead of an element-by-element basis. In other words, every data element in the first data element set is compared to a corresponding data element in the second data element set before a third data element set is considered. In examples described above, a measure of similarity is derived between corresponding data elements in different data element sets by determining how close the values of the corresponding data elements are to each other. In other examples, the measure of similarity is derived by calculating a difference between corresponding data elements in different sets of data elements. The measure of similarity may therefore be inversely proportional to the size of the calculated difference. For example, corresponding data elements may be deemed to be sufficiently similar if the size of the calculated difference is below a predetermined threshold. The calculated difference may be used to derive difference data. Difference data may be derived by calculating differences between each data element in the first set of data elements and each corresponding data element in the second set of data elements. As such, the measure of similarity may be derived by analysing an absolute value in the difference data. The difference data therefore exploits temporal correlation between a first time sample of the signal and a later time sample of the signal. The difference data may be used instead of the second set of data elements to represent the later time sample of the signal. In other words, the later time sample may be represented as a temporal change relative to the first time sample. A stronger extent of temporal correlation between the first time sample and the later time sample corresponds to a smaller size of the difference data used to represent the later time sample. A smaller size of the difference data corresponds to a relatively high importance of the first time sample and a relatively high dependence of the later time sample on the first time sample. It is therefore more important that the values in the first time sample are accurately reflected. In some examples, the difference data is quantised using one or more quantisation parameters.

In examples described above, a quantisation parameter for a time sample of a signal is determined on a per time sample basis. In other examples, different quantisation parameters could be determined for different parts or regions of a given time sample. For example, a quantisation parameter could be determined for each tile that is part of the given time sample.

Various measures (for example apparatuses, methods and computer programs) are provided. A first value of a first data element in a first set of data elements is obtained. The first set of data elements is based on a first time sample of a signal. A second value of a second data element in a second set of data elements is obtained. The second set of data elements is based on a second time sample of a signal. A measure of similarity is derived between the first value and the second value. At least one quantisation parameter is determined based on the derived measure of similarity. The at least one quantisation parameter is useable in performing quantisation on data based on the first time sample of the signal. Output data is generated using the at least one quantisation parameter.

A position of the second data element in the second data element set may be the same as a position of the first data element in the first data element set.

The at least one quantisation parameter may indicate one or more levels of quantisation, a level of quantisation being inversely proportional to an associated measure of similarity.

The signal may comprise a plurality of time samples including the first and second time samples. The at least one quantisation parameter may be determined based on an overall bit rate target for the plurality of time samples.

Operation may be in accordance with a tiered hierarchy having multiple different levels of quality. The tiered hierarchy may have at least a relatively high level of quality and a relatively low level of quality. The first set of data elements may be at the relatively high level of quality.

The at least one quantisation parameter may comprise a first quantisation parameter and a second quantisation parameter. The first quantisation parameter may be useable in performing quantisation on data at the relatively low level of quality. The second quantisation parameter may be useable in performing quantisation on data at the relatively high level of quality.

The first set of data elements may be based on a set of residual elements. The set of residual elements may be useable to reconstruct a first representation of the first time sample of the signal at the relatively high level of quality using a second representation of the first time sample of the signal at the relatively high level of quality. The second representation may be based on a representation of the first time sample of the signal at the relatively low level of quality.

The first set of data elements may comprise the set of residual elements.

The first set of data elements may comprise a set of correlation elements indicative of an extent of correlation between a plurality of residual elements in the set of residual elements.

A representation of the first time sample of the signal at the relatively low level of quality may be derived by performing a downsampling operation on the first representation of the first time sample of the signal. The second representation of the first time sample of the signal may be derived by performing an upsampling operation on the representation of the first time sample of the signal at the relatively low level of a quality. The first set of data elements may be obtained by comparing the first representation of the first time sample of the signal with the second representation of the first time sample of the signal.

A preliminary representation of the first time sample of the signal at the relatively low level of quality may be derived by performing the downsampling operation on the first representation. Encoded data at the relatively low level of quality may be generated by performing an encoding operation on the preliminary representation. Decoded data at the relatively low level of quality may be generated by performing a decoding operation on the encoded data. The representation at the relatively low level of quality may be derived based on the decoded data.

Correction data may be generated by comparing the decoded data with the preliminary representation at the relatively low level of quality.

The data based on the first time sample of the signal may comprise the correction data.

A preliminary second representation of the first time sample of the signal at the relatively high level of quality may be derived by performing an upsampling operation on the preliminary representation of the first time sample of the signal at the relatively low level of quality. A preliminary quantisation parameter may be determined based on the preliminary second representation.

The preliminary quantisation parameter may be used as the at least one quantisation parameter.

The preliminary quantisation parameter may be useable to perform the quantisation on the data based on the first time sample of the signal. The at least one quantisation parameter may be useable to adjust the quantisation on the data based on the first time sample of the signal.

The quantisation on the data based on the first time sample of the signal may be performed.

The data based on the first time sample of the signal may be the first set of data elements.

The second, later time sample of the signal may immediately follow the first time sample in the signal.

A similarity score for the first data element may be incremented in response to determining that the measure of similarity exceeds a predetermined threshold. The at least one quantisation parameter may be determined based on the similarity score for the first data element.

The similarity score for the first data element may be maintained in response to determining that the measure of similarity does not exceed the predetermined threshold.

A third value of a third data element in a third set of data elements may be obtained in response to determining that the measure of similarity exceeds the predetermined threshold. The third set of data elements may be based on a third time sample of the signal. The third time sample of the signal may be later than both the first and second time samples of the signal. A further measure of similarity may be derived between the third value and the first and/or second value. The similarity score for the first data element may be incremented in response to determining that the further measure of similarity exceeds the predetermined threshold.

An overall similarity score for the first time sample may be generated by combining a plurality of similarity scores. Each of the plurality of similarity scores may be associated with a different data element in the first set of data elements. The at least one quantisation parameter may be determined based on the overall similarity score.

A plurality of overall similarity scores may be generated. Each overall similarity score in the plurality of similarity scores may be for a different time sample in the plurality of time samples. The at least one quantisation parameter may be determined based on the plurality of overall similarity scores.

Determining the at least one quantisation parameter may involve analysing only some of the time samples in the plurality of time samples.

At least one further quantisation parameter may be determined based on the derived measure of similarity between the first value and the second value. The at least one further quantisation parameter may be useable in performing quantisation on data based on the second, later time sample of the signal. Further output data may be generated using the at least one further quantisation parameter.

It is to be understood that any feature described in relation to any one embodiment may be used alone, or in combination with other features described, and may also be used in combination with one or more features of any other of the embodiments, or any combination of any other of the embodiments. Furthermore, a equivalents and modifications not described above may also be employed without departing from the scope of the invention, which is defined in the accompanying claims.

What is claimed is:

1. An apparatus configured to:
   obtain a first value of a first data element in a first set of data elements, the first set of data elements being based on a first time sample of a signal;
   obtain a second value of a second data element in a second set of data elements, the second set of data elements being based on a second, later time sample of the signal;
   derive a measure of similarity between the first value and the second value;
   determine, based on the derived measure of similarity, at least one quantisation parameter useable in performing quantisation on data based on the first time sample of the signal; and
   generate output data using the at least one quantisation parameter,
   wherein the apparatus is configured to:
   generate an overall similarity score for the first time sample by combining a plurality of similarity scores, each of the plurality of similarity scores being associated with a different data element in the first set of data elements; and
   determine the at least one quantisation parameter based on the overall similarity score.

2. An apparatus according to claim 1, wherein the signal comprises a plurality of time samples including the first and second time samples, the apparatus being configured to:
   generate a plurality of overall similarity scores, each overall similarity score in the plurality of overall similarity scores being for a different time sample in the plurality of time samples; and
   determine the at least one quantisation parameter based on the plurality of overall similarity scores.

3. An apparatus according to claim 1, wherein the signal comprises a plurality of time samples including the first and second time samples and wherein the determining the at least one quantisation parameter involves analysing only some of the time samples in the plurality of time samples.

4. An apparatus according to claim 1, the apparatus being configured to:
   determine, based on the derived measure of similarity between the first value and the second value, at least one further quantisation parameter useable in performing quantisation on data based on the second, later time sample of the signal; and
   generate further output data using the at least one further quantisation parameter.

5. An apparatus according to claim 1, wherein the apparatus is configured to operate in accordance with a tiered hierarchy having multiple different levels of quality, the tiered hierarchy having at least a relatively high level of quality and a relatively low level of quality, and wherein the first set of data elements is at the relatively high level of quality.

6. An apparatus according to claim 5, wherein the at least one quantisation parameter comprises a first quantisation parameter and a second quantisation parameter, the first quantisation parameter being useable in performing quantisation on data at the relatively low level of quality and the second quantisation parameter being useable in performing quantisation on data at the relatively high level of quality.

7. An apparatus according to claim 5, wherein the first set of data elements is based on a set of residual elements, the set of residual elements being useable to reconstruct a first representation of the first time sample of the signal at the relatively high level of quality using a second representation of the first time sample of the signal at the relatively high level of quality, the second representation being based on a representation of the first time sample of the signal at the relatively low level of quality.

8. An apparatus according to claim 7, the apparatus being configured to:
   derive the representation of the first time sample of the signal at the relatively low level of quality by:
     performing a downsampling operation on the first representation of the first time sample of the signal to derive a preliminary representation,
     instructing an encoding operation on the preliminary representation to generate encoded data at the relatively low level of quality,
     instructing a decoding operation on the encoded data to generate decoded data at the relatively low level of quality, and
     obtaining the representation at the relatively low level of quality based on the decoded data;
   derive the second representation of the first time sample of the signal by performing an upsampling operation on the representation of the first time sample of the signal at the relatively low level of quality; and
   obtain the first set of data elements by comparing the first representation of the first time sample of the signal with the second representation of the first time sample of the signal.

9. An apparatus according to claim 8, the apparatus being configured to generate correction data by comparing the decoded data with the preliminary representation at the relatively low level of quality, wherein the data based on the first time sample of the signal comprises the correction data.

10. An apparatus according to claim 8, the apparatus being configured to:
   derive a preliminary second representation of the first time sample of the signal at the relatively high level of quality by performing an upsampling operation on the preliminary representation of the first time sample of the signal at the relatively low level of quality; and
   determine a preliminary quantisation parameter based on the preliminary second representation.

11. An apparatus according to claim 10,
   wherein the preliminary quantisation parameter is useable to perform the quantisation on the data based on the first time sample of the signal; and
   wherein the at least one quantisation parameter is useable to adjust the quantisation on the data based on the first time sample of the signal.

12. An apparatus according to claim 1, the apparatus being configured to:
   increment a similarity score for the first data element in response to determining that the measure of similarity exceeds a predetermined threshold; and
   determine the at least one quantisation parameter based on the similarity score for the first data element.

13. A method comprising:
   obtaining a first value of a first data element in a first set of data elements, the first set of data elements being based on a first time sample of a signal;
   obtaining a second value of a second data element in a second set of data elements, the second set of data elements being based on a second, later time sample of the signal;
   deriving a measure of similarity between the first value and the second value;
   determining, based on the derived measure of similarity, at least one quantisation parameter useable in performing quantisation on data based on the first time sample of the signal; and
   generating output data using the at least one quantisation parameter,
   wherein the method further comprises:
   generating an overall similarity score for the first time sample by combining a plurality of similarity scores, each of the plurality of similarity scores being associated with a different data element in the first set of data elements; and
   determining the at least one quantisation parameter based on the overall similarity score.

14. A method according to claim 13, wherein the signal comprises a plurality of time samples including the first and second time samples, the method comprising:
   generating a plurality of overall similarity scores, each overall similarity score in the plurality of overall similarity scores being for a different time sample in the plurality of time samples; and
   determining the at least one quantisation parameter based on the plurality of overall similarity scores.

15. A method according to claim 13, wherein the signal comprises a plurality of time samples including the first and second time samples and wherein the determining the at least one quantisation parameter involves analysing only some of the time samples in the plurality of time samples.

16. A method according to claim 13, the method comprising:
   determining, based on the derived measure of similarity between the first value and the second value, at least one further quantisation parameter useable in performing quantisation on data based on the second, later time sample of the signal; and
   generating further output data using the at least one further quantisation parameter.

17. A method according to claim 13,
   the method being performed in accordance with a tiered hierarchy having multiple different levels of quality, the tiered hierarchy having at least a relatively high level of quality and a relatively low level of quality, and wherein the first set of data elements is at the relatively high level of quality,
   wherein the at least one quantisation parameter comprises a first quantisation parameter and a second quantisation parameter, the first quantisation parameter being useable in performing quantisation on data at the relatively high level of quality and the second quantisation parameter being useable in performing quantisation on data at the relatively low level of quality,
   wherein the first set of data elements is based on a set of residual elements, the set of residual elements being useable to reconstruct a first representation of the first time sample of the signal at the relatively high level of quality using a second representation of the first time sample of the signal at the relatively high level of quality, the second representation being based on a representation of the first time sample of the signal at the relatively low level of quality.

18. A method according to claim 17, the method comprising:

deriving the representation of the first time sample of the signal at the relatively low level of quality by:

performing a downsampling operation on the first representation of the first time sample of the signal to derive a preliminary representation, instructing an encoding operation on the preliminary representation to generate encoded data at the relatively low level of quality, instructing a decoding operation on the encoded data to generate decoded data at the relatively low level of quality, and deriving the representation at the relatively low level of quality based on the decoded data;

deriving the second representation of the first time sample of the signal by performing an upsampling operation on the representation of the first time sample of the signal at the relatively low level of quality;

obtaining the first set of data elements by comparing the first representation of the first time sample of the signal with the second representation of the first time sample of the signal; and generating correction data by comparing the decoded data with the preliminary representation at the relatively low level of quality.

19. A method according to claim 18, the method comprising:

deriving a preliminary second representation of the first time sample of the signal at the relatively high level of quality by performing an upsampling operation on the preliminary representation of the first time sample of the signal at the relatively low level of quality; and determining a preliminary quantisation parameter based on the preliminary second representation;

wherein the preliminary quantisation parameter is useable to perform the quantisation on the data based on the first time sample of the signal; and wherein the at least one quantisation parameter is useable to adjust the quantisation on the data based on the first time sample of the signal.

20. A non-transitory computer-readable medium storing computer program code comprising instructions that, if executed by a computer processor would cause an apparatus to:

obtain a first value of a first data element in a first set of data elements, the first set of data elements being based on a first time sample of a signal;

obtain a second value of a second data element in a second set of data elements, the second set of data elements being based on a second, later time sample of the signal;

deriving a measure of similarity between the first value and the second value, including generating an overall similarity score for the first time sample by combining a plurality of similarity scores, each of the plurality of similarity scores being associated with a different data element in the first set of data elements;

determine, based on the derived measure of similarity, at least one quantisation parameter useable in performing quantisation on data based on the first time sample of the signal, the at least one quantisation parameter being determined based on the overall similarity score; and generate output data using the at least one quantisation parameter.

* * * * *